(12) United States Patent
Shirasaki

(10) Patent No.: US 7,914,952 B2
(45) Date of Patent: Mar. 29, 2011

(54) LITHOGRAPHIC PELLICLE

(75) Inventor: Toru Shirasaki, Annaka (JP)

(73) Assignee: Shin-Etsu Chemical Co., Ltd., Tokyo (JP)

( * ) Notice: Subject to any disclaimer, the term of this patent is extended or adjusted under 35 U.S.C. 154(b) by 282 days.

(21) Appl. No.: 12/176,725

(22) Filed: Jul. 21, 2008

(65) Prior Publication Data

US 2009/0029269 A1    Jan. 29, 2009

(30) Foreign Application Priority Data

Jul. 19, 2007   (JP) ................. 2007-188713

(51) Int. Cl.
*G03F 1/00* (2006.01)

(52) U.S. Cl. .......................................... 430/5

(58) Field of Classification Search ......... 430/5; 428/14
See application file for complete search history.

(56) References Cited

U.S. PATENT DOCUMENTS

| | | | |
|---|---|---|---|
| 6,795,170 B2 * | 9/2004 | Mishiro et al. ................. | 355/75 |
| 2003/0095245 A1 | 5/2003 | Mishiro | |
| 2004/0091796 A1 | 5/2004 | Nagata | |
| 2005/0157288 A1 | 7/2005 | Van Peski | |

FOREIGN PATENT DOCUMENTS

JP    2003007832    10/2003

OTHER PUBLICATIONS

Wistrom R et al. "Influence of the pellicle on final photomask flatness" Proceedings of the SPIE- The International Society for Optical Engineering SPIE-INT. Soc. Opt. Eng USA, vol. 6283, No. 1, 2006, pp. 628326-1 XP002501649.

Fujita M et al. "Pellicle-induced distortions in advanced phototmasks" Proceedings of the SPIE-The International Society for Optical Engineering, SPIE, Bellingham, VA; US vol. 4754, Jul. 1, 2002, pp. 589-596, XP002464927; whole document.

Cotte e p et al. "Experimental and numerical studies of the effects of materials and attachment conditions on pellicle-induced distortions in advanced photomasks" Proceedings of the SPIE—The International Society for Optical Engineering, SPIE, Bellingham, VA; US vol. 4754, Jan. 1, 2002, pp. 579-588, XP002339129; figures 4, 8, p. 585, line 13-p. 586, line 15; figure 16.

* cited by examiner

*Primary Examiner* — Stephen Rosasco

(74) *Attorney, Agent, or Firm* — Lowe Hauptman Ham & Berner, LLP

(57) ABSTRACT

The present invention is directed to provide a pellicle that can control the deformation of the photomask to a minimum without particular consideration of the flatness of a pellicle frame even in the case where a pellicle is affixed to a photomask for lithography. In the pellicle of the present invention, the pellicle comprises a photomask adhesive for affixing the pellicle to a photomask, the photomask adhesive having a flat surface, wherein the flatness of the surface is no more than 15 μm.

1 Claim, No Drawings

LITHOGRAPHIC PELLICLE

BACKGROUND OF THE INVENTION

1. Field of the Invention

The present invention relates to a lithographic pellicle, in particular to a lithographic pellicle used as dust-proof protection in the manufacture of semiconductor devices such as LSI or ultra-LSI. More particularly, the invention relates to a lithographic pellicle frame used for ultraviolet exposure light of 200 nm or shorter wavelength used for patterning light exposure which requires high resolution.

2. Description of the Related Art

Conventionally, the manufacture of semiconductor devices such as LSI and ultra-LSI, or liquid crystal display panels and the like, has involved employing procedures such as lithography for the patterning of semiconductor wafers or liquid crystal original plates through irradiation of light. However, there is a problem that any dust adhering to the employed original plate absorbs and reflects light, which deforms and roughens the edges of the replicated patterning, thereby detracting from dimensions, quality, and appearance, and impairing the performance of the semiconductor device and/or liquid crystal display panel, while reducing the manufacturing yield thereof.

Thus, these operations are ordinarily carried out in clean rooms, but keeping exposure original plates clean at all times in such clean rooms is difficult, and hence pellicles having good light transmissivity are adhered, as dust-proof protection, to the surface of exposure original plates. The advantage of the pellicle is that dust does not attach directly to the surface of the exposure original plate, but becomes adhered to the pellicle membrane, so that if focus is in accord with the pattern of the exposure original plate during lithography, transfer is not affected by dust on the pellicle.

The pellicle is made up of a pellicle frame comprising aluminum, stainless steel, polyethylene or the like, a transparent pellicle membrane adhered on the upper surface of the pellicle frame, comprising nitrocellulose, cellulose acetate or the like having good light transmissivity, an adhesive layer coated on the lower surface of the pellicle frame, and a release layer (separator) adhered on the adhesive layer. The adhesive bonding between the pellicle frame and pellicle membrane is carried out by coating a good solvent for the pellicle membrane material and then air-drying the solvent (Japanese Patent Application Laid-open No. S58-219023) or using an adhesive agent such as an acrylic resin, epoxy resin or the like (U.S. Pat. No. 4,861,402, Japanese Patent Examined Application Publication No. S63-27707, Japanese Unexamined Patent Application Laid-open No. H07-168345).

As a result of ever higher lithography resolutions encountered in recent years, the employed light sources are gradually shifting to shorter wavelengths in order to realize such resolutions. Specifically, there has been a shift towards g-line (436 nm), i-line (365 nm), KrF excimer lasers (248 nm) in ultraviolet light, while ArF excimer lasers (193 nm) have begun to be used recently.

In a semiconductor exposure device, the pattern drawn on a photomask is burned onto a silicon wafer by way of short-wavelength light. Irregularities on the photomask and the silicon wafer give rise however to focal shift, which impairs the pattern printed onto the wafer. The required flatness from photomasks and silicon wafers is getting more stringent as the patterning becomes finer and finer. For instance, the required flatness from photomasks is becoming gradually more demanding, from a flatness of 2 μm at the pattern plane, down to 0.5 μm and 0.25 μm for the 65 nm node and beyond.

A pellicle is affixed to a photomask to protect a pattern from dirt after the photomask is completed, but affixing the pellicle to the photomask may cause a change in the flatness of the photomask. This is generally thought to be an effect of unevenness of the pellicle frame on the planarity of the photomask. Furthermore, the change of the flatness due to the pellicle affixation unfortunately may also cause a deformation of the circuit pattern made on the photomask. This is thought to be due to a change of the relative position of the pattern on the photomask due to the change in the planarity of the photomask.

The pellicle is affixed to the photomask by a photomask adhesive applied to one side of the pellicle frame, but in the case where the pellicle is affixed to the photomask, normally, the pellicle is attached by pressure to the photomask with a force of about 20 to 30 kgf. Conventional pellicle frames generally are made of aluminum alloy. Pellicle frames used in semiconductor lithography have a width of about 150 mm and a length of about 110 to 130 mm, and have a shape with an opening in a central region. Generally, pellicle frames are manufactured by cutting a plate of aluminum alloy into the pellicle frame shape, or extrusion molding of aluminum alloy material into the pellicle frame shape.

Generally, the planarity of a photomask exhibits a TIR value of several μm or less, and the same of a leading-edge photomask is 1 μm or less; while the planarity of the pellicle frame, generally being about several tens μm, is comparatively larger than that of the photomask. Therefore, in the case where the pellicle frame is affixed to the photomask, the unevenness of the pellicle frame may cause a change in the flatness of the photomask. Here, it is thought that improving the flatness of the pellicle frame to the level of the flatness of the photomask will allow a reduction of the planarity change of the photomask. However, the pellicle frame has a thin frame shape with a width of about 2 mm, and therefore is easily deformed; and it is not always easy to make a flat pellicle frame. Therefore, it is difficult to achieve a flatness of the pellicle frame similar to the level of that of the photomask.

Moreover, even in the case where a pellicle frame having a very good flatness is used, in the case where the flatness of a surface of the adhesive layer is poor, the flatness of the adhesive affects the flatness change of the photomask. Normally, during the affixation of the pellicle, pressurizing the pellicle causes firstly convex portions of the adhesive layer to contact the photomask, and then finally concave portions to contact; and the affixation is completed without an air path anywhere around the entire periphery of the pellicle. However, in this case, the initially contacting convex portions of the adhesive undergo more deformation from the affixation, and therefore the deformation stress in these portions is larger than that of the concave portions, thereby resulting in an uneven distribution of stress in the surface. As a result, the affixation of the pellicle causes a deformation of the photomask.

In consideration of circumstances such as those recited above, the present invention is directed to prevent the occurrence of distortion of the photomask even in the case where the pellicle is affixed to the photomask.

SUMMARY OF THE INVENTION

To solve the discrepancies recited above, the inventor of the present invention discovered that the deformation of the photomask can be controlled to a minimum even in the case where the pellicle is affixed to the photomask, by forming a flat surface of the adhesive layer and making the flatness of the surface 15 μm or less. In other words, a pellicle used in lithography of the present invention comprises a photomask adhesive for affixing the pellicle to a photomask, the photomask adhesive having a flat surface, wherein the flatness of the surface is no more than 15 μm.

According to the present invention, even in the case where a pellicle is affixed to a photomask for lithography, the deformation of the photomask can be controlled to a minimum without particular consideration of the flatness of a pellicle frame.

DESCRIPTION OF PREFERRED EMBODIMENTS

Generally, the adhesive of the pellicle is applied onto an end face of the pellicle frame in liquid form, after which heat treatment, UV processing, or the like is performed, thereby hardening the liquid adhesive to finish forming the adhesive layer. Here, in the case where the hardening processing is performed directly after application of the adhesive, the shape of the adhesive layer resulting from the application from an adhesive orifice does not change easily; few portions transition to a flat surface and many are arch-shaped; and moreover, even in the case where time is given to deform, the adhesive applied accordant with the shape of the pellicle frame is expected to exhibit a flatness similar to that of the pellicle frame.

In the case where the pellicle, with the adhesive having the unaltered arch shape, is affixed to the photomask, the adhesive gradually deforms as it affixes to the photomask. At this time, the adhesive undergoes deformation stress, which may result in a deformation of the photomask. Furthermore, in the case where the adhesive is uneven, the deformation amount is different by location, and therefore it is thought that the deformation of the photomask is greater.

On the other hand, in the case where the adhesive has a sufficiently flat surface, the affixation of the pellicle to the photomask occurs by the contact of the flat surface to the photomask, and therefore a deformation of the adhesive during affixation does not occur. As a result, deformation of the photomask as well does not occur. To form the flat surface, the liquid adhesive is applied to an end face of the pellicle frame, after which the adhesive is brought into contact with a flat surface, and the adhesive is hardened in that configuration; and thus the flat surface can be formed on the adhesive layer.

To avoid deformation of the adhesive occurring during the affixation, it is necessary for the adhesive surface to have a flatness similar to the flatness of a substrate. Fundamentally, the flatness of the adhesive surface is affected by the flatness of the contact surface during formation. Therefore, in the case where a member having a flatness similar to that of the photomask surface is used as the flat surface for contact with the adhesive, it is expected that the flatness of the adhesive will be about the same as the flatness of the photomask.

Therefore, ideally, in the case where the adhesive has a flat portion, and the flatness thereof is similar to the level of that of the photomask, deformation of the adhesive does not occur even when the pellicle is affixed to the photomask, and essentially deformation of the photomask as well is prevented. Furthermore, the adhesive essentially absorbs the unevenness of the pellicle frame during formation of the flat surface; that is, the flatness of the adhesive surface can be controlled regardless of the flatness of the pellicle frame, and therefore in the case where the pellicle has a flat adhesive surface, the effects of the pellicle frame unevenness essentially can be controlled to a minimum.

Therefore, in the case where the flatness of the photomask adhesive surface of the pellicle is as good as possible, and favorably similar to the flatness of the photomask to which the pellicle is affixed, for example 1 μm or less, no particular photomask distortion occurs. Naturally, it is even more favorable when the flatness of the adhesive surface is better than that of the photomask. However, volumetric contraction generally occurs during the hardening reaction of the adhesive, and therefore it is difficult to transfer the flatness of the contact surface unaltered to the adhesive surface during the formation of the flat portion of the adhesive. Therefore, in reality, removing the adhesive from the contact surface results in some deterioration of the flatness. However, the Young's modulus of the adhesive is quite small as compared to that of the pellicle frame, and therefore, a certain level, in reality a flatness of 15 μm or less, is sufficient to control the change of the photomask flatness from affixation of the pellicle.

EXAMPLES

Hereinafter, examples of the present invention are described, but the present invention is not limited to these examples.

Example 1

A pellicle frame made of aluminum alloy (outer dimensions of 149 mm×113 mm×4.5 mm, with a thickness of 2 mm; having a flatness of 15 μm on the adhesive side) was cleaned in purified water, after which a silicone adhesive (product number: X-40-3122A) made by Shin-Etsu Chemical Co., Ltd. was applied to an end face thereof, and left at room temperature for one hour. A separator was placed onto a quartz glass plate having a flatness of 3 μm, upon which the pellicle frame applied with the adhesive was placed. At this time, the adhesive was brought into contact with the separator, and a flat surface was formed on the adhesive. Then, the pellicle frame on the glass plate was placed in an oven at 60° C., and the adhesive was hardened. After hardening the adhesive, the separator was peeled off.

Then, a bonding agent (product number: Cytop CTX-A) made by Asahi Glass Co., Ltd. was applied to the opposite surface of the pellicle frame. Then, the pellicle frame was heated at 130° C., and the bonding agent was hardened. Then, the bonding agent side of the pellicle frame recited above was affixed to a pellicle film held by an aluminum frame that is larger than the pellicle frame, and the portion extending beyond an exterior of the pellicle frame was removed, thus completing the pellicle.

The adhesive of the pellicle had a flat surface. Furthermore, the flatness of the pellicle was measured using a laser displacement meter having an XY stage. The flatness of the film bonding agent side was 15 μm, and the flatness of the adhesive surface was 15 μm. The pellicle was affixed to a photomask having a flatness of 0.25 μm, and the flatness of the photomask increased to 0.30 μm. The amount of change was controlled to a sufficiently small value of 0.05 μm. The measurement results of the flatness of the adhesive surface and the amount of change of the flatness of the photomask before and after affixation of the pellicle are presented, together with those of the following Examples and Comparative Example, in Table 1.

Example 2

A pellicle frame made of aluminum alloy (outer dimensions of 149 mm×113 mm×4.5 mm, with a thickness of 2 mm; having a flatness of 15 μm on the adhesive side) was cleaned in purified water, after which a silicone adhesive (product number: X-40-3122A) made by Shin-Etsu Chemical Co., Ltd. was applied to an end face thereof, and left at room temperature for one hour. The pellicle frame applied with the adhesive was placed upon a quartz glass plate having a flatness of 3 μm. At this time, the adhesive was brought into contact with the glass plate, and a flat surface was formed on the adhesive. Then, the pellicle frame on the glass plate was placed in an oven at 60° C., and the adhesive was hardened. After hardening the adhesive, the pellicle frame was pulled up gently as the pellicle frame was heated at 150° C. and the pellicle was peeled off the glass plate.

Then, a bonding agent (product number: Cytop CTX-A) made by Asahi Glass Co., Ltd. was applied to the opposite surface of the pellicle frame. Then, the pellicle frame was heated at 130° C., and the bonding agent was hardened. Then, the bonding agent side of the pellicle frame recited above was affixed to a pellicle film held by an aluminum frame that is larger than the pellicle frame, and the portion extending beyond an exterior of the pellicle frame was removed, thus completing the pellicle.

The adhesive of the pellicle had a flat surface. Furthermore, the flatness of the pellicle was measured using a laser displacement meter having an XY stage. The flatness of the film bonding agent side was 15 μm, and the flatness of the adhesive surface was 5 μm. The pellicle was affixed to a photomask having a flatness of 0.25 μm, and the flatness of the photomask increased to 0.28 μm. The amount of change was controlled to a sufficiently small value of 0.03 μm.

Example 3

A pellicle frame made of aluminum alloy (outer dimensions of 149 mm×113 mm×4.5 mm, with a thickness of 2 mm; having a flatness of 30 μm on the adhesive side) was cleaned in purified water, after which a silicone adhesive (product number: X-40-3122A) made by Shin-Etsu Chemical Co., Ltd. was applied to an end face thereof, and left at room temperature for one hour. The pellicle frame applied with the adhesive was placed upon a quartz glass plate having a flatness of 3 μm. At this time, the adhesive was brought into contact with the glass plate, and a flat surface was formed on the adhesive.

Then, the pellicle frame on the glass plate was placed in an oven at 60° C., and the adhesive was hardened. After hardening the adhesive, the pellicle frame was pulled up gently as the pellicle frame was heated at 150° C. and the pellicle was peeled off the glass plate. Then, a bonding agent (product number: Cytop CTX-A) made by Asahi Glass Co., Ltd. was applied to the opposite surface of the pellicle frame. Then, the pellicle frame was heated at 130° C., and the bonding agent was hardened. Then, the bonding agent side of the pellicle frame recited above was affixed to a pellicle film held by an aluminum frame that is larger than the pellicle frame, and the portion extending beyond an exterior of the pellicle frame was removed, thus completing the pellicle.

The adhesive of the pellicle had a flat surface. Furthermore, the flatness of the pellicle was measured using a laser displacement meter having an XY stage. The flatness of the film bonding agent side was 30 μm, and the flatness of the adhesive surface was 5 μm. The pellicle was affixed to a photomask having a flatness of 0.25 μm, and the flatness of the photomask increased to 0.28 μm. In spite of the pellicle frame having the worse frame flatness compared to Example 2, the amount of change was 0.03 μm, which was the same amount as that in Example 2, and controlled to a sufficiently small value.

Example 4

A pellicle frame made of aluminum alloy (outer dimensions of 149 mm×113 mm×4.5 mm, with a thickness of 2 mm; having a flatness of 15 μm on the adhesive side) was cleaned in purified water, after which a silicone adhesive (product number: X-40-3122A) made by Shin-Etsu Chemical Co., Ltd. was applied to an end face thereof, and left at room temperature for one hour. The pellicle frame applied with the adhesive was placed upon a quartz glass plate having a flatness of 0.5 μm. At this time, the adhesive was brought into contact with the glass plate, and a flat surface was formed on the adhesive. Then, the pellicle frame on the glass plate was placed in an oven at 60° C., and the adhesive was hardened. After hardening the adhesive, the pellicle frame was pulled up gently as the pellicle frame was heated at 150° C. and the pellicle was peeled off the glass plate.

Then, a bonding agent (product number: Cytop CTX-A) made by Asahi Glass Co., Ltd. was applied to the opposite surface of the pellicle frame. Then, the pellicle frame was heated at 130° C., and the bonding agent was hardened. Then, the bonding agent side of the pellicle frame recited above was affixed to a pellicle film held by an aluminum frame that is larger than the pellicle frame, and the portion extending beyond an exterior of the pellicle frame was removed, thus completing the pellicle. The adhesive of the pellicle had a flat surface. Furthermore, the flatness of the pellicle was measured using a laser displacement meter having an XY stage. The flatness of the film bonding agent side was 15 μm, and the flatness of the adhesive surface was 1 μm. The pellicle was affixed to a photomask having a flatness of 0.25 μm, and the flatness of the photomask remained the same value of 0.25 μm.

Comparative Example 1

A pellicle frame made of aluminum alloy (outer dimensions of 149 mm×113 mm×4.5 mm, with a thickness of 2 mm; having a flatness of 15 μm on the adhesive side) was cleaned in purified water, after which a silicone adhesive (product number: X-40-3122A) made by Shin-Etsu Chemical Co., Ltd. was applied to an end face thereof, and left at room temperature for one hour. A separator was placed onto a quartz glass plate having a flatness of 3 μm, upon which the pellicle frame applied with the adhesive was placed. Then, the adhesive was brought into contact with the separator. Then, the pellicle frame was placed in an oven at 60° C., and the adhesive was hardened. After hardening the adhesive, the separator was peeled off. Then, a bonding agent (product number: Cytop CTX-A) made by Asahi Glass Co., Ltd. was applied to the opposite surface of the pellicle frame. Then, the pellicle frame was heated at 130° C., and the bonding agent was hardened. Then, the bonding agent side of the pellicle frame recited above was affixed to a pellicle film held by an aluminum frame that is larger than the pellicle frame, and the portion extending beyond an exterior of the pellicle frame was removed, thus completing the pellicle.

The adhesive of the pellicle had no flat surface. Furthermore, the flatness of the pellicle was measured using a laser displacement meter having an XY stage. The flatness of the film bonding agent side was 15 μm. Since there was no flat surface on the adhesive, the measurements of the flatness was impossible to be performed. The pellicle was affixed to a photomask having a flatness of 0.25 μm, and the flatness of the photomask worsened to 0.45 μm.

TABLE 1

| | Frame flatness (μm) | Adhesive flatness (μm) | Photomask flatness (μm) | | |
|---|---|---|---|---|---|
| | | | Before affixing | After affixing | Deformation |
| Example 1 | 15 | 15 | 0.25 | 0.30 | +0.05 |
| Example 2 | 15 | 5 | 0.25 | 0.28 | +0.03 |
| Example 3 | 30 | 5 | 0.25 | 0.28 | +0.03 |
| Example 4 | 15 | 1 | 0.25 | 0.25 | +0.00 |
| Comparative Example 1 | 15 | — | 0.25 | 0.45 | +0.20 |

An excellent pellicle frame can be provided that enables reduction of the deformation of a photomask during the pellicle affixation by improving the flatness of the adhesive layer formed on the pellicle frame; and therefore, the industrial utility value is quite high in fields using semiconductor lithography.

What is claimed is:

1. A pellicle used in semiconductor lithography, comprising:
   a frame, a membrane bonded on one end face, and a photomask adhesive bonded on the other end face for affixing the pellicle to a photomask, characterized in that said photomask adhesive has a flat surface of a flatness of no more than 15 μm.

* * * * *